US008192652B2

(12) United States Patent
Ting et al.

(10) Patent No.: US 8,192,652 B2
(45) Date of Patent: Jun. 5, 2012

(54) TIN-DOPED INDIUM OXIDE THIN FILMS AND METHOD FOR MAKING SAME

(75) Inventors: Chu-Chi Ting, Minhsiung Township (TW); Chia-Hao Tsai, Minhsiung Township (TW); Hsiang-Chen Wang, Minhsiung Township (TW)

(73) Assignee: National Chung Cheng University, Minhsiung Township, Chiayi County (TW)

( * ) Notice: Subject to any disclaimer, the term of this patent is extended or adjusted under 35 U.S.C. 154(b) by 231 days.

(21) Appl. No.: 12/778,183

(22) Filed: May 12, 2010

(65) Prior Publication Data

US 2011/0278510 A1    Nov. 17, 2011

(51) Int. Cl.
*H01B 1/08* (2006.01)
*B05D 5/12* (2006.01)
*C23C 14/34* (2006.01)

(52) U.S. Cl. ............ 252/520.1; 252/520.5; 252/521.1; 427/96.8; 204/192.15

(58) Field of Classification Search ............ 252/520.1, 252/520.5, 521.1; 427/96.8, 99.2, 126.3; 204/192.15
See application file for complete search history.

(56) References Cited

U.S. PATENT DOCUMENTS

| 4,027,192 A * | 5/1977 | Hanak ................. 313/498 |
| 6,042,752 A * | 3/2000 | Mitsui ................. 252/520.1 |
| 7,537,714 B2 * | 5/2009 | Choi et al. ............ 252/520.5 |

OTHER PUBLICATIONS

Psuja et al "Fabrication and luminescent properties of ITO nanocrystalline coated micro Eu:Y2O3 particles", Nanophotonics II, SPIE VOl 6988, 69881S (May 2008).*

* cited by examiner

*Primary Examiner* — Mark Kopec
(74) *Attorney, Agent, or Firm* — Frenkel & Associates, PC

(57) ABSTRACT

The tin-doped indium oxide thin film in accordance with the present invention has a tin-doped indium oxide, yttrium ions and europium ions, wherein the yttrium ions are proportional to 0.1-10 mol % of the tin-doped indium oxide while the europium ions proportional to 0.05-5 mol % of the tin-doped indium oxide. The method in accordance with the present invention comprises preparing a tin-doped indium oxide; and doping yttrium ions proportional to 0.1-10 mol % of the tin-doped indium and europium ions proportional to 0.05-5 mol % of the tin-doped indium oxide in the tin-doped indium oxide using a film-manufacturing method.

12 Claims, 10 Drawing Sheets

TIN-DOPED INDIUM OXIDE THIN FILMS AND METHOD FOR MAKING SAME

BACKGROUND OF THE INVENTION

1. Field of the Invention

The present invention relates to a tin-doped indium oxide thin film and a method for making the tin-doped indium oxide thin film.

2. Description of the Prior Art

Although theoretical basis for current available solar cells is well established, research and development on new materials, structures and manufacturing processes is necessary to significantly improve solar cell efficiency.

Sunlight after penetrating earth atmosphere roughly comprises 5% ultraviolet and 45% visible and infrared light. Most absorbing materials are too narrow to effectively absorb light across such a broad spectrum. Therefore, one method for improving solar cell efficiency is converting sunlight into narrower spectrum light that is absorbable for a semiconductive absorbing material. Two known solutions are commonly implemented.

A first known solution is to provide a laminated solar cell that has more than two accumulating absorbing layers. An upper layer absorbs a short wavelength sunlight and a lower layer absorbs long wavelength portions to cover the spectrum of and to fully utilize sunlight.

The first known solution may be a laminated solar cell made from III-V group materials. However, due to extremely high cost, laminated solar cells made from III-V group materials are generally limited to extraterrestrial applications rather than generally practical industrial applications.

A second known solution is to use luminescent solar concentrators (LSC). An LSC is made from a luminescence converting material that absorbs ultraviolet or infrared wavelengths and emits visible light either up or down-converted from solar infrared or ultraviolet light, respectively. The semiconductive absorbing material then absorbs the visible light emitted by the LSC.

An LSC solar cell is less efficient than a laminated solar cell due to inefficiencies during light-conversion. Nevertheless, an LSC solar cell that generally employs only one layer of solar cell usually costs less than a laminated solar cell that has multiple layers of solar cells. The second known solution is considered a low-cost solution for raising efficiency of solar cells.

As mentioned above, an LSC is used to achieve better absorption of ultraviolet and infrared light. According to known literatures, in most cases, LSC's are externally mounted onto absorbing materials of solar cells. For example, an up-converting LSC thin film and a down-converting LSC thin film may be respectively attached to the top and the bottom of an LSC solar cell to allow the absorbing material of the solar cell to utilize both the ultraviolet portion and the infrared portion of sunlight.

However, visible light emitted by the LSC thin films first passes through multiple interfaces before reaching the absorbing material. Scattering, reflection and total reflection at each interface decreases intensity of the visible light that reaches the absorbing material. Besides, additional processes necessary for making the LSC thin films increases manufacture time and cost.

Literatures discussing application of rare earth elements on semiconductors focus primarily on thin-film electroluminescent (TFEL) devices. Conventional electroluminescent devices can be categorized into two groups, one of which is related to luminescent powders and luminescent thin films and the other is characterized by being driven with alternating current (AC).

AC driven thin-film electroluminescent devices (ACTFEL) and AC driven powder electroluminescent devices are commercially available in relevant industries. An ACTFEL device has a metal-insulator-semiconductor-insulator-metal structure formed on a basal plate. In other words, the ACTFEL device has an insulator-semiconductor-insulator (DSD) structure mounted between two electrodes.

Conventional rare earth element-doped transparent conductive thin films are, as reported in literatures, doped with single rare earth element. For example, indium oxide ($In_2O_3$) thin films doped with europium ion ($Eu^{3+}$) or tin oxide thin films doped with europium ion. It is known that a thin film having tin-doped indium oxide (ITO) as a basic material and doped with europium ion does not emit strong luminescence. Furthermore, since indium oxide and tin oxide is less conductive than ITO, the luminescent indium oxide thin films doped with europium ion and tin oxide thin films doped with europium ion do not exhibit high conductivity.

Dimple P. Dutta, as published in *Journal of Physical Chemistry C*, 112 page 6781-6785, indicated that The photoluminescence (PL) spectra of $In_2O_3$ nanoparticles showed peaks in visible region characteristic of shallow traps present within the nanoparticles. Weak luminescence was observed in europium doped indium oxide nanoparticles.

Experimental results of PL, The absence of $In_2O_3$ host band in the excitation spectrum of $Eu^{3+}$ indicates that there is almost no energy transfer from the $In_2O_3$ host to the doped $Eu^{3+}$, the results show that $In_2O_3$ on the Eu ions, is not a good light-emitting host material.

Do Hyung Parki, as published in *Journal of the Electrochemical Society*, 153 page H63-67, indicated that a luminescent conductive thin film can be obtained by direct radio frequency sputtering a conductive tin oxide material and luminescent europium oxide material onto a basal quartz plate. Do Hyung Parki also mentioned that raising concentration of europium ion leads to concentration quenching and reduction of resistivity.

Experimental results of PL-measuring a powder structure and a thin film structure made with an optimal factor of Eu 1 atom % divulge that the powder structure and the thin film structure indeed emit light. Excited wavelength of the powder structure is 30 nm longer than that of the thin film structure, which is due to formation of different crystal morphology and tendency of the thin film structure to have more bulk properties than the powder structure.

Do Hyung Parki also disclosed a luminescent TCP transparent conductive layer. The TCP layer emits light, which is similar to luminescent powder and TCO, a transparent conductive material, when electrically stimulated. A recent TFEL device comprises a luminescent powder and a TCP layer. Both the luminescent powder and the TCP layer emit light when being excited by electrons and thus intensity of total luminescence is raised. However, the means disclosed by Do Hyung Parki failed to raise the low conductivity of a thin film doped with only europium ion.

R. Kudrawiec, as published on *Materials Science and Engineering B*, 105, page 53-56, 2003, disclosed a europium ion doped indium oxide thin film made on a basal plate of Silicon, quartz and porous anodic alumina (PAA) using a dry-gel method. Thin films of R. Kudrawiec on different kinds of basal plates emit light at 615 nm when exited by beams at 275 nm. However the thin film provided by R. Kudrawiec exhibits a low transparency for ultraviolet as well as a low conductivity.

To overcome the shortcomings, the present invention provides a tin-doped indium oxide thin film and a method for making same to mitigate or obviate the aforementioned problems.

SUMMARY OF THE INVENTION

The main objective of the invention is to provide a luminescent and conductive tin-doped indium oxide thin film. Another aspect of the present invention also relates to a method for making the tin-doped indium oxide thin film.

The tin-doped indium oxide thin film in accordance with the present invention has a tin-doped indium oxide, yttrium ions and europium ions, wherein the yttrium ions are proportional to 0.1-10 mol % of the tin-doped indium oxide while the europium ions proportional to 0.05-5 mol % of the tin-doped indium oxide.

The method in accordance with the present invention comprises preparing a tin-doped indium oxide; and doping yttrium ions proportional to 0.1-10 mol % of the tin-doped indium and europium ions proportional to 0.05-5 mol % of the tin-doped indium oxide in the tin-doped indium oxide using a film-manufacturing method.

The tin-doped indium oxide thin film in accordance with the present invention is codoped with yttrium and europium, both of which are rare earth elements, and manufactured with a sol-gel thin film making process. By codoping with yttrium and europium, intensity of the visible light emitted at 611 nm by the tin-doped indium oxide thin film is significantly raised. Nevertheless transparency to visible light of the tin-doped indium oxide thin film reaches 90%. It is apparent that with the process and manufacture disclosed herein, the present invention is able to provide an ultraviolet-absorbing and visible light emitting tin-doped indium oxide thin film that is capable of down-converting and is thus suitable for using as a transparent conductive layer in solar cells.

The tin-doped indium oxide thin film differs from conventional luminescence converting thin film primarily in direct codoping of atoms as luminescence-emitting centers in a down-converting process into lattices of a transparent conductive layer of a solar cell. The luminescence-emitting center absorbs ultraviolet and emits visible light for a semiconductive absorbing layer that is usually attached to a bottom of a solar cell. As a luminescent conductive layer, the tin-doped indium oxide thin film in accordance of the present invention is capable of significantly raising the conversion efficiency of a solar cell. Substantially, the tin-doped indium oxide thin film in accordance of the present invention is useful as a transparent conductive layer of an LSC of a solar cell.

The tin-doped indium oxide thin film in accordance of the present invention, codoped with less than 0.5% of yttrium ion and less than 0.1% of europium, emits luminescence while exhibiting the same resistivity as a conventional tin-doped indium oxide thin film that is not codoped with rare earth elements.

The tin-doped indium oxide thin film in accordance of the present invention codoped with yttrium and europium is not only suitable for an LSC of a solar cell, but also suitable for TFEL devices. The performing features, especially brightness, viewing angle and ruggedness, of the tin-doped indium oxide thin film may be adjusted by adjusting amounts of codoping yttrium ions and europium ions.

In other words, the present invention provides a tin-doped indium oxide thin film codoped with rare earth elements, yttrium and europium, that is useful as a transparent conductive thin film capable of emitting visible luminescence.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
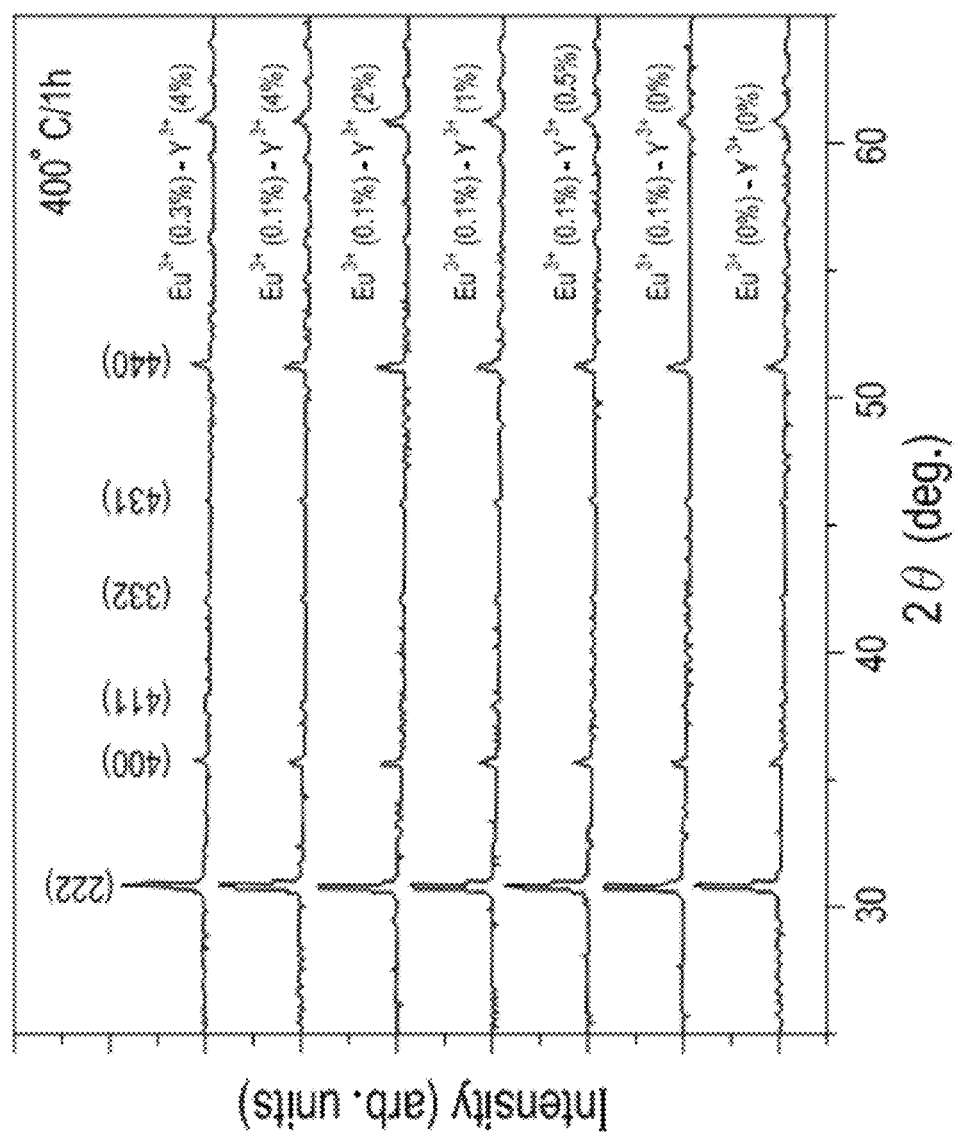
FIG. 1 is XRD patterns of tin-doped indium oxide thin films codoped with 0, 0.1 and 0.3 mol % of europium ions and 0, 0.5, 1, 2 and 4 mol % of yttrium ions annealed at 400° C. for 1 hour in accordance with the present invention.
Figure 2:
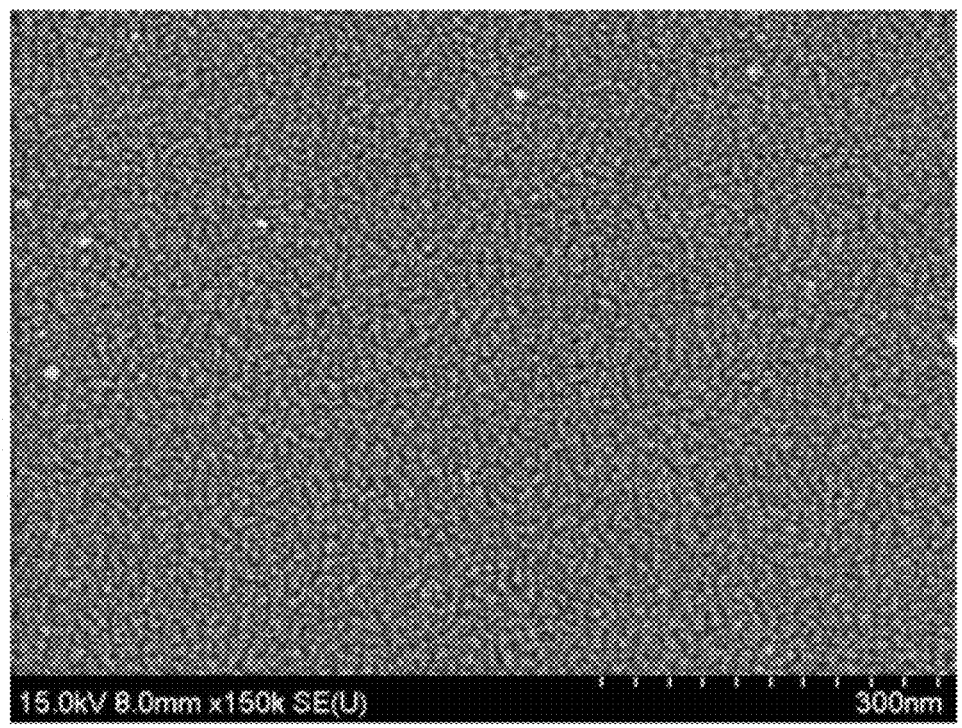
FIG. 2 is a scanning electron microscopic image magnified 150 times of a tin-doped indium oxide thin film that is non-codoped.
Figure 3:
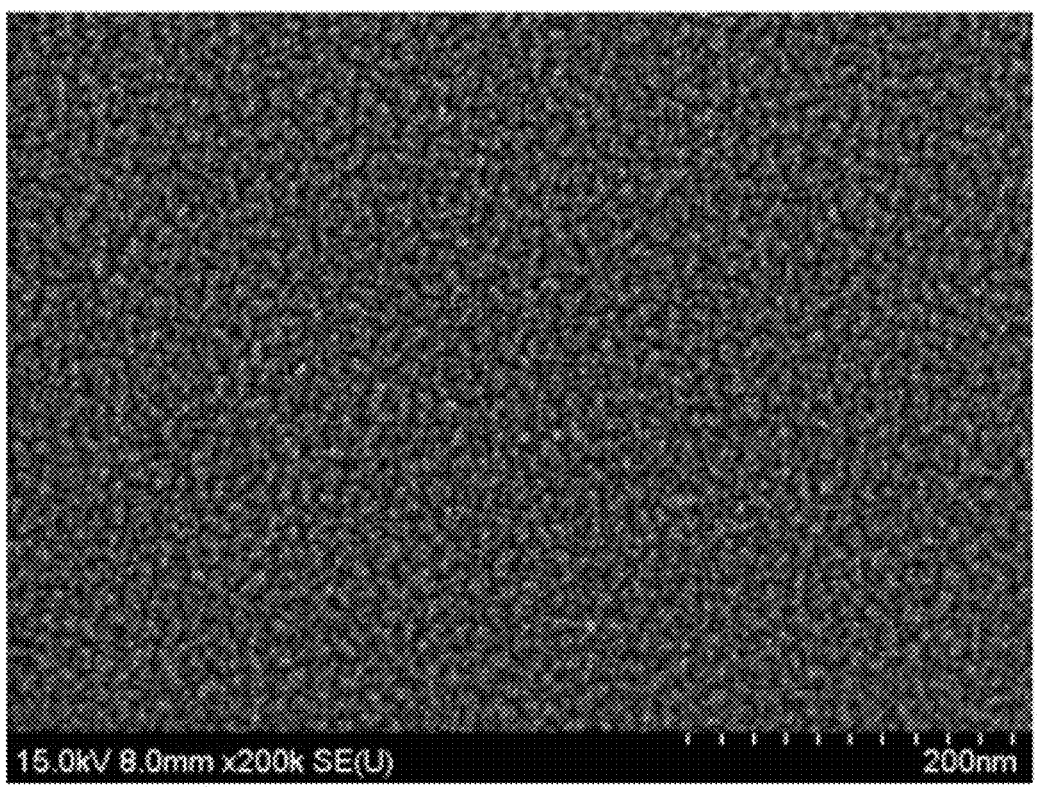
FIG. 3 is a scanning electron microscopic image magnified 200 times of the tin-doped indium oxide thin film of FIG. 2.
Figure 4:
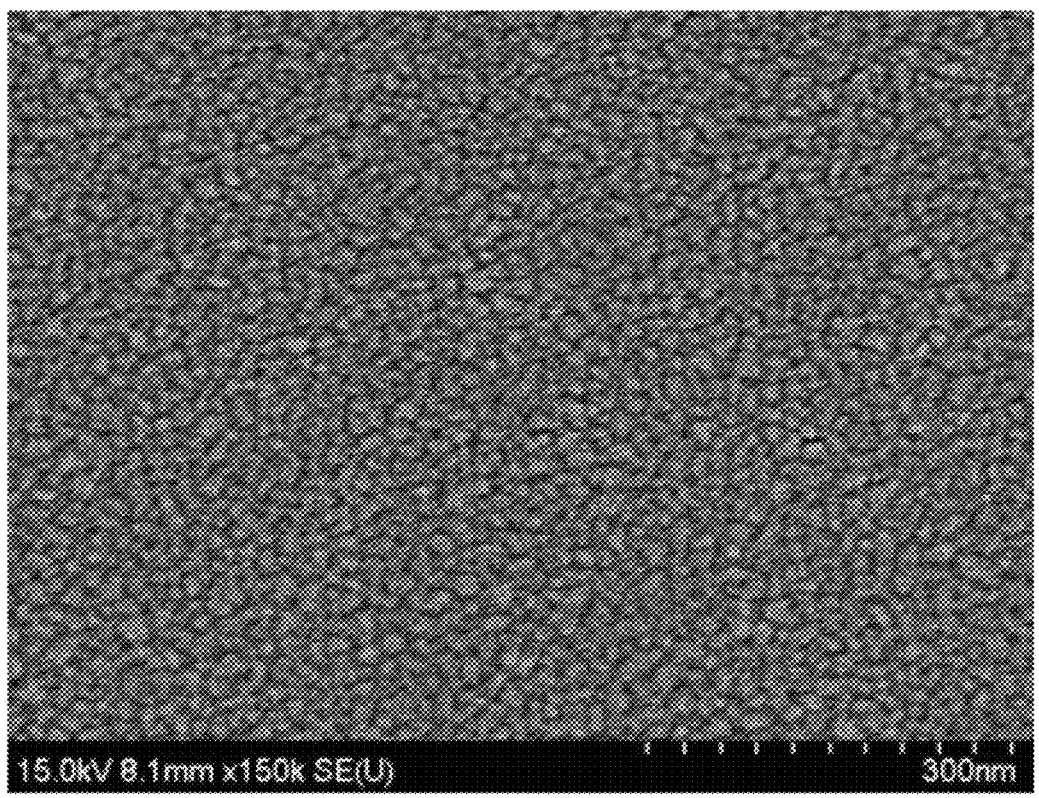
FIG. 4 is a scanning electron microscopic image magnified 150 times of a tin-doped indium oxide thin film codoped with 0.1 mol % of europium ions and 1 mol % of yttrium ions and annealed at 400° C. for 1 hour.
Figure 5:
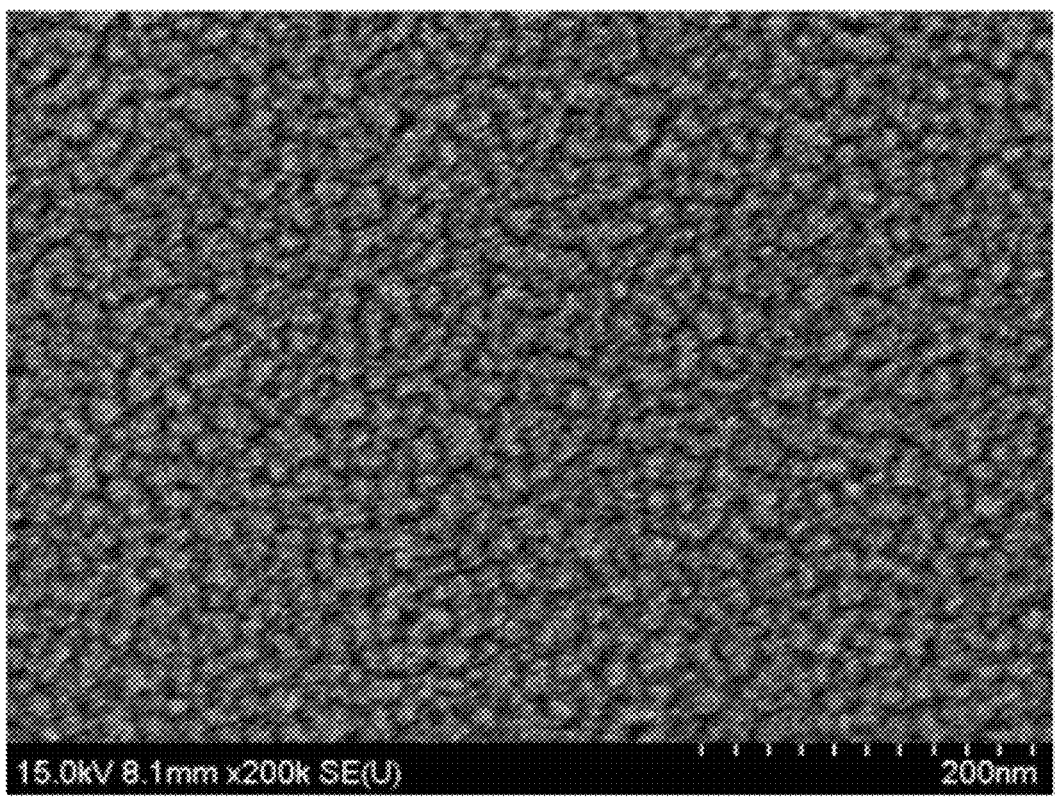
FIG. 5 is a scanning electron microscopic image magnified 200 times of the tin-doped indium oxide thin film of FIG. 3.

The tin-doped indium oxide thin film is codoped with europium ions and yttrium ions using a film-manufacturing method. The film manufacturing method may be a sol-gel spin coating method or other methods that employ a liquid phase with ions, especially a sputtering method or a metal-organic chemical vapor deposition method.

The present invention discloses a means to alternate chemical environment around a europium ion with addition of yttrium ions, which allows the europium ion to be optimally symmetric and be able to luminescence. Further to the sol-gel spin coating method and the sputtering method of which details are disclosed in following part of this specification, other methods, especially a metal-organic chemical vapor deposition method, may also be used to perform the addition of yttrium ions. A method for making the tin-doped indium oxide thin film employing a film-manufacturing method other than a sol-gel spin coating method or a sputtering method is also encompassed by the present invention.

EXAMPLE 1

The current example discloses a method in accordance with the present invention for making a tin-doped indium oxide thin film codoped with yttrium ions and europium ions with a sol-gel spin coating method. The method in accordance with the present invention comprises:

preparing a tin-doped indium oxide; and doping yttrium ions proportional to 0.1-10 mol % of the tin-doped indium and europium ions proportional to 0.05-5 mol % of the tin-doped indium oxide in the tin-doped indium oxide using a film-manufacturing method, wherein the film-manufacturing method is a sol-gel spin coating method. An indium precursor and a tin precursor and then an yttrium ion precursor and a europium ion precursor are mixed to form a sol-gel solution having tin-doped indium oxide, yttrium ions and europium ions. The sol-gel solution is then heated, preferably at 400° C., to obtain a tin-doped indium oxide thin film comprising yttrium ions and europium ions. The sol-gel solution may be a transparent solution.

1. A process for making the sol-gel solution comprises:

a) mixing acetic acid (HAc, $C_2H_4O_2$) with 2-methoxyethanol (2-MOE, $HOC_2H_4OCH_3$) for 10 minutes to obtain a mixture solution;

b) adding indium nitrate (indium (III) nitrate, $In(NO_3)_3$, purity 99.995%, purchased from Acros) as an indium ion precursor to the mixture solution, ultrasonically shaking the mixture solution for 20 minutes and continuously stirring the solution for 10 minutes to completely dissolve the indium nitrate in the mixture solution;

c) mixing tin tetrachloride ($SnCl_4$), as a tin precursor, and absolute ethyl alcohol ($C_2H_5OH$) to obtain a mixture and adding the mixture to the mixture solution, wherein the molar ratio of tin and indium is 90:10;

d) adding yttrium nitrate, as an yttrium precursor to the mixture solution and stirring for 3 minutes;

e) adding europium nitrate, as a europium precursor to the mixture solution and stirring for 3 minutes; and f) stirring the mixture solution for 10 hours at room temperature to obtain a sol-gel solution comprising tin-doped indium oxide, yttrium ions and europium ions.

2. A thin film manufacturing process comprises:

a) evenly zzz dripping the sol-gel solution onto a glass basal plate and performing a first spin coating at 1000 rpm for 10 seconds followed by a second spin coating at 4000 rpm for 30 seconds to obtain a coating layer; and b) drying the coating layer by soft baking at 200° C., raising the temperature of a tubular furnace by 5° C. per minute to 400° C., inserting a furnace tube for 30 minutes and holding the temperature for 10 minutes and then removing the furnace tube for 20 minutes to remove organic residues and obtaining a tin-doped indium oxide thin film.

Aforementioned step a) and step b) of the thin film manufacturing process may be repeated to obtain a pure tin-doped indium oxide thin film codoped with yttrium ions and europium ions, which luminesces and is conductive.

The europium ion precursor may be selected from a group consisting of europium nitrate, europium carbonate, europium chloride, europium oxalate, europium acetate and europium isopropoxide.

The yttrium ion precursor may be selected from a group consisting of yttrium nitrate, yttrium carbonate, yttrium chloride, yttrium acetate, yttrium oxalate and yttrium isopropoxide.

The indium precursor may be selected from a group consisting of indium nitrate, indium chloride, indium ethoxide, indium isopropoxide and indium butoxide.

The tin precursor may be selected from a group consisting of tin chloride, tin ethoxide, tin isopropoxide and tin butoxide.

The foregoing compounds, for example tin chloride, tin ethoxide, tin isopropoxide and tin butoxide, are commonly known compounds used in making a sol-gel solution. The disclosure in the example is sufficient to enable a skilled artisan to use the compounds to practice the present invention. Other compounds used in conventional sol-gel preparations may also be employed when practicing the present invention without escaping the scope of the present invention.

EXAMPLE 2

With reference to FIG. 1, tin-doped indium oxide thin films are codoped with 0, 0.1 and 0.3 mol % of europium ions and 0, 0.5, 1, 2 and 4 mol % of yttrium ions annealed at 400° C. for 1 hour. These tin-doped indium oxide thin films exhibits similar peaks (222) in the XRD patterns. The observation of the XRD patterns indicates that the crystallinity (degree of crystallization) of the tin-doped indium oxide thin films made with different factors are the same. The codoped trance europium ions (0, 0.1 and 0.3 mol %) and the yttrium ions (0, 0.5, 1, 2 and 4 mol %) do not disrupt the lattice of tin-doped indium oxide.

With reference to FIGS. 2 to 5, crystal grains of the tin-doped indium oxide codoped with trace europium ions and yttrium ions are larger than the crystal grains of tin-doped indium oxide that is not codoped with europium ions or yttrium ions.

Figure 6:
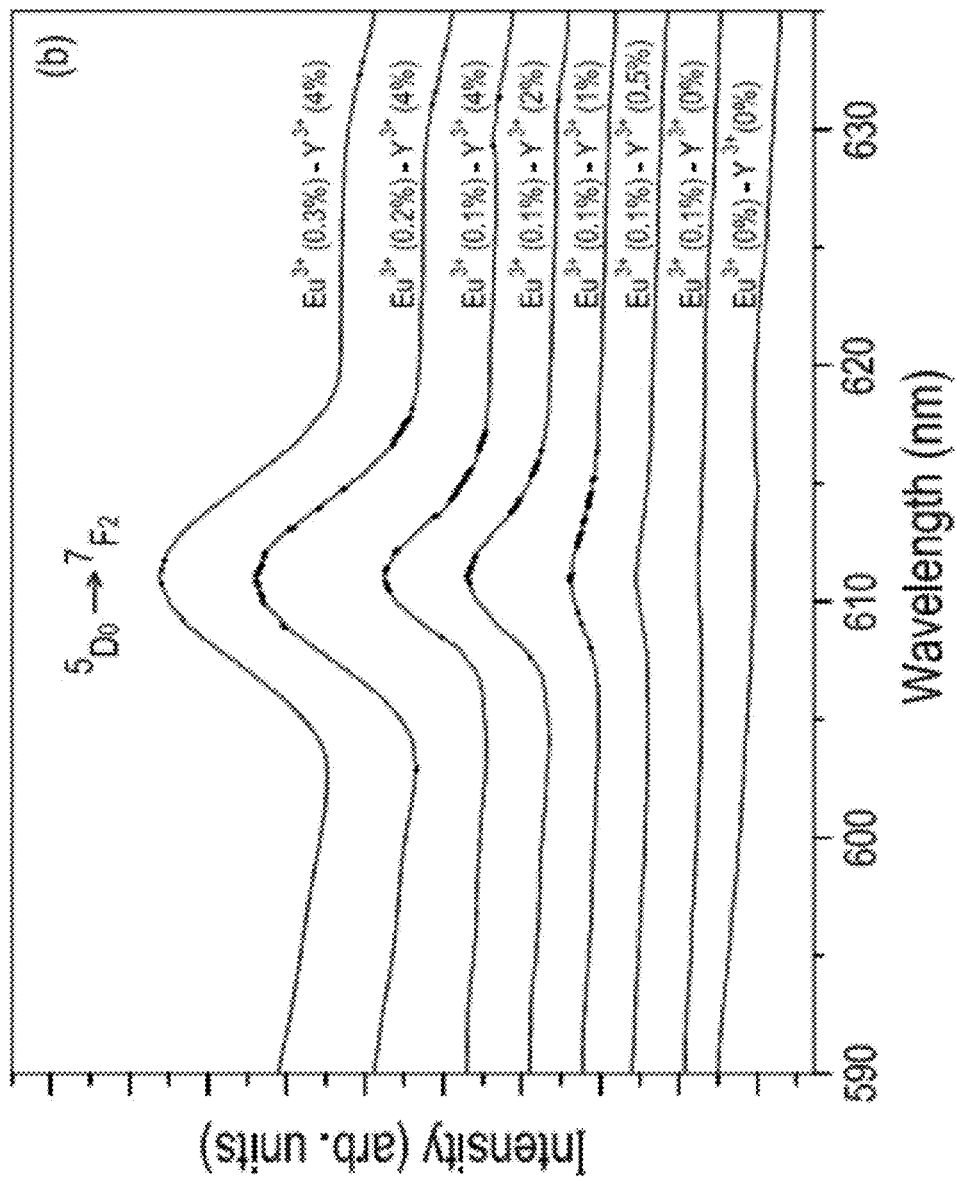
FIG. 6 is a chart of luminescence emitted by tin-doped indium oxide thin films when excited by a 254 nm beam, wherein the tin-doped indium oxide thin films are codoped with 0, 0.1 0.2 and 0.3 mol % of europium ions and 0, 0.5, 1, 2 and 4 mol % of yttrium ions and annealed at 400° C. for 1 hour.
Figure 7:
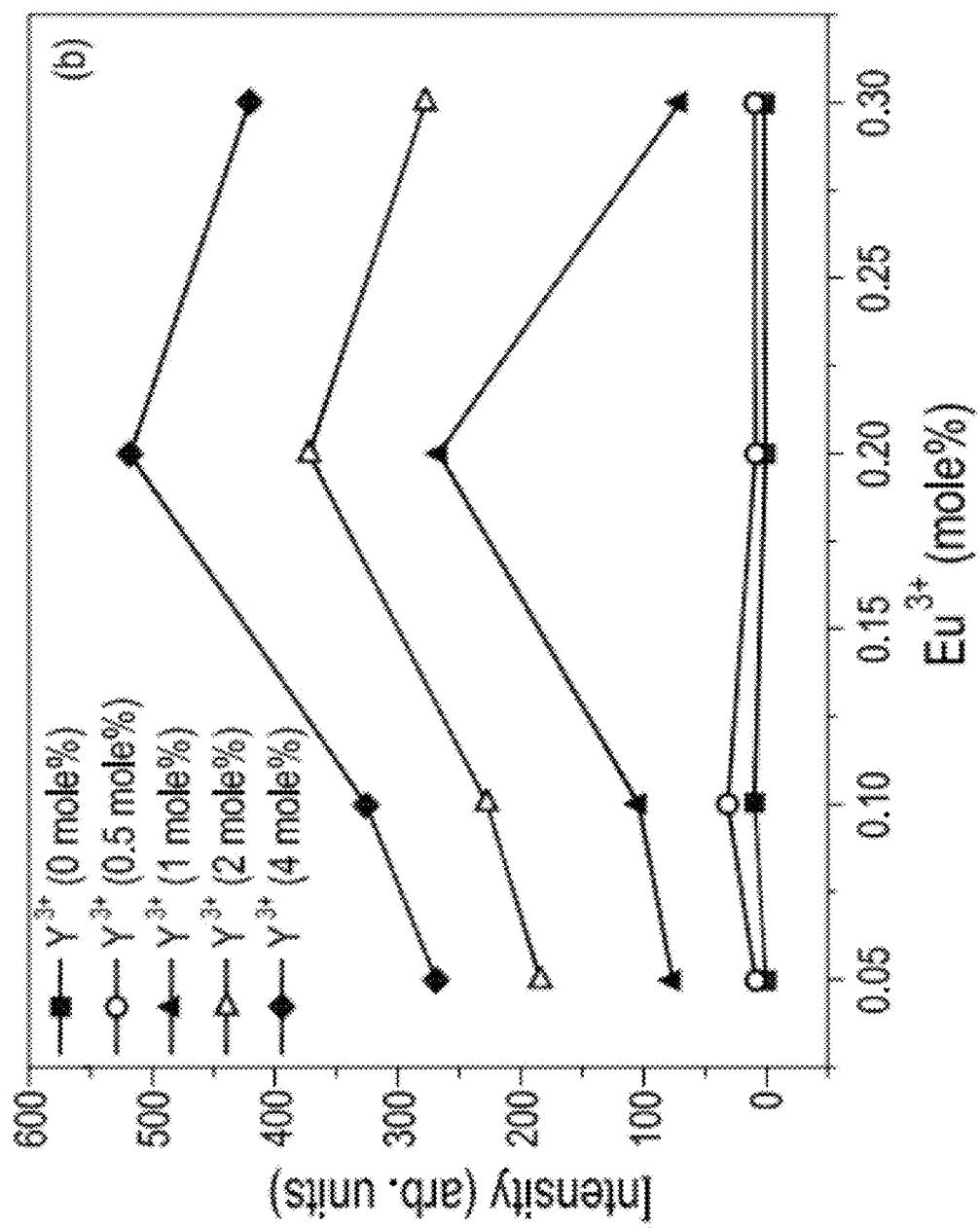
FIG. 7 is a chart of intensity at 611 nm of light emitted by the tin-doped indium oxide thin films of FIG. 6.
Figure 8:
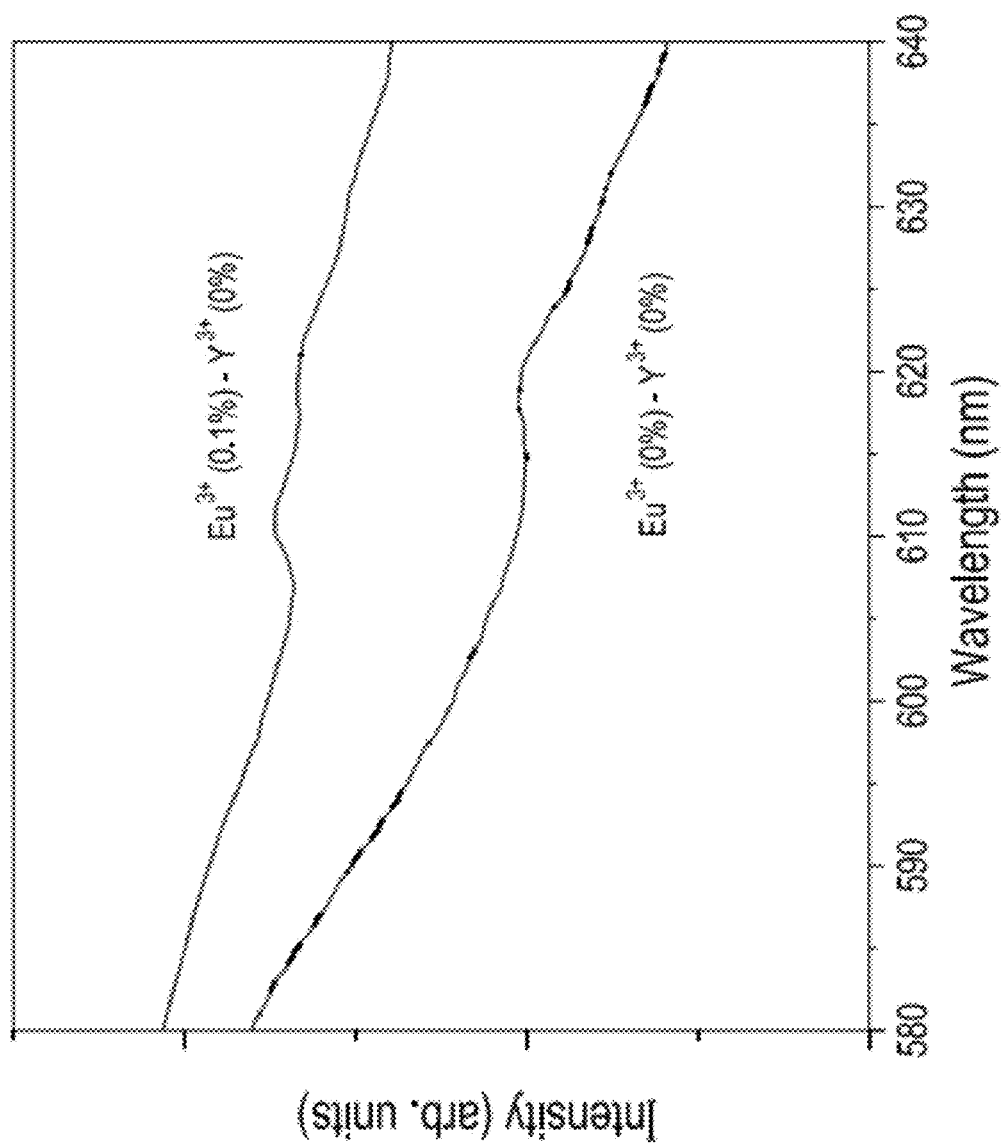
FIG. 8 is a partially enlarged chart of the chart of FIG. 6.

With reference to FIGS. 6 to 8, increased amount of codoped yttrium ions allows the tin-doped indium oxide thin film codoped with europium ions and yttrium ions to emit red light at 611 nm when excited with a 254 nm beam.

Figure 9:
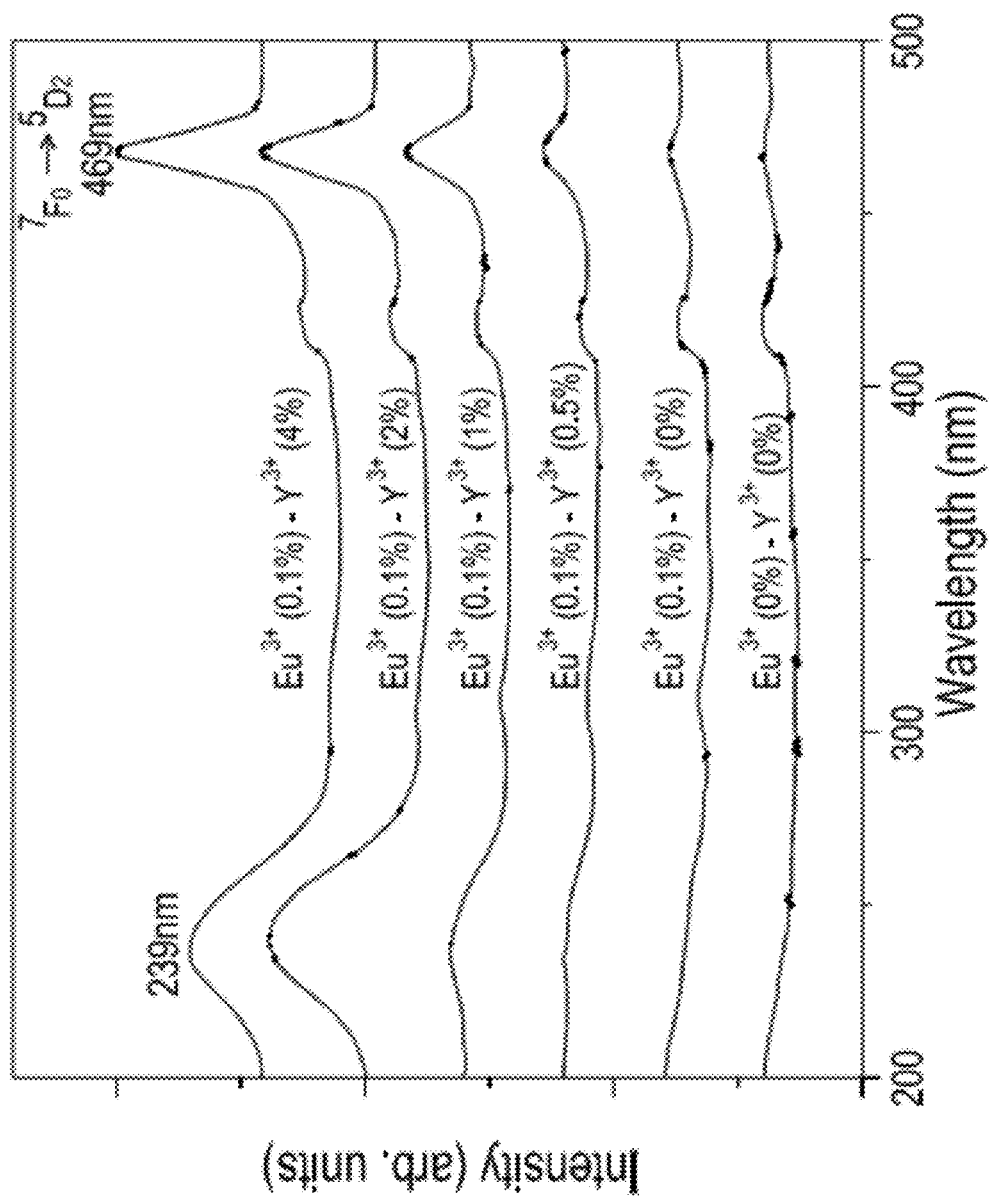
FIG. 9 is a $^5D_0 \rightarrow ^7F_2$ transition spectrum of tin-doped indium oxide thin films codoped with 0.1 mol % of europium ions and 1 mol % of yttrium ions and annealed at 400° C. for 1 hour.

With reference to FIG. 9, the peaks at 239 nm and 469 nm become more significant with a rise in the amount of codoped yttrium ions.

Figure 10:
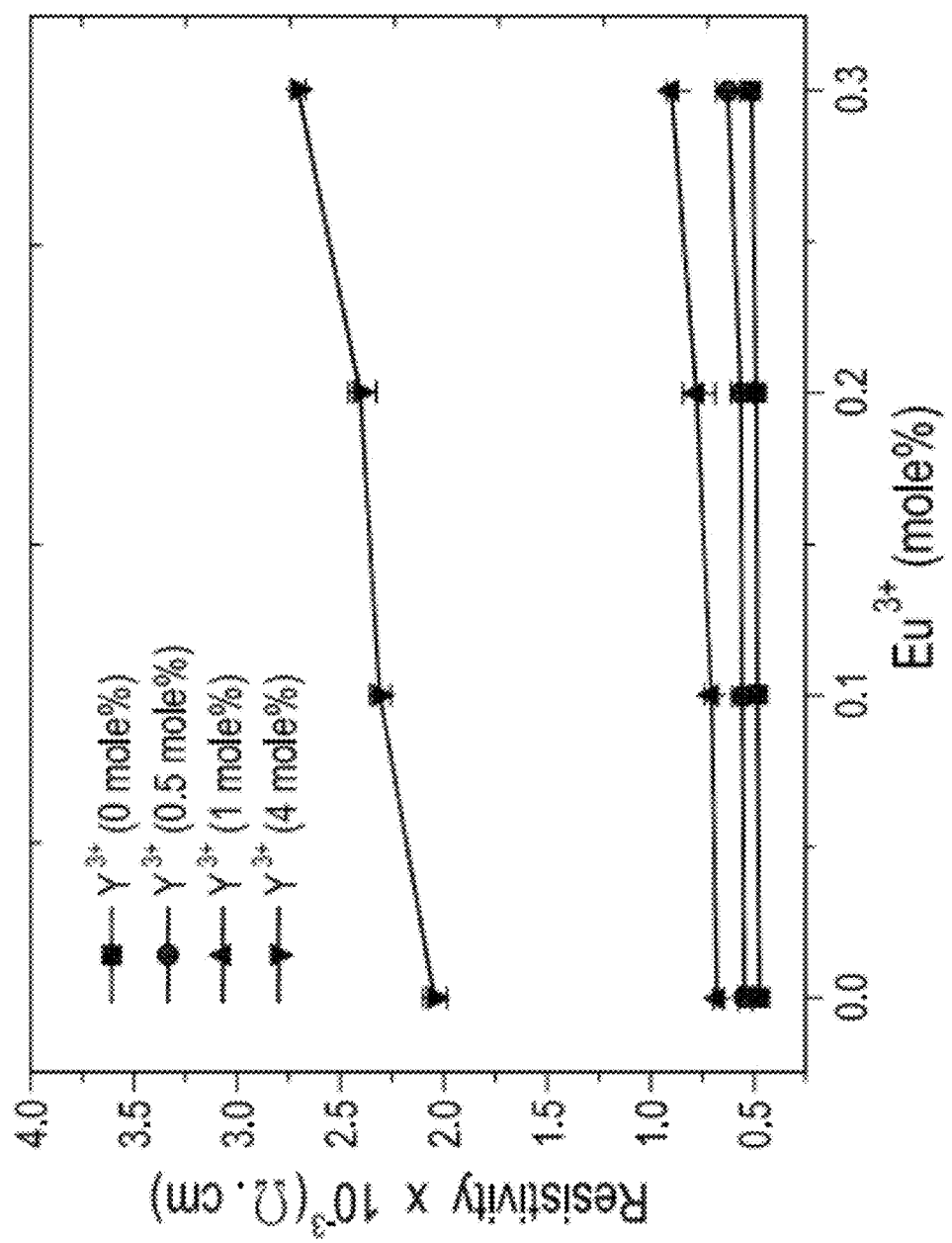
FIG. 10 is a chart of the resistivities of tin-doped indium oxide thin films codoped with 3 mol % of europium ions and various concentrations of yttrium ions and annealed at 400° C. for 1 hour.

With reference to FIG. 10, the resistivity of a tin-doped indium oxide thin film codoped with 3 mol % of europium ions and 0.5 mol % of yttrium ions is 15% higher than the resistivity of a tin-doped indium oxide thin film codoped with no europium ions or yttrium ions. The resistivity of a tin-doped indium oxide thin film codoped with 3 mol % of europium ions and 1 mol % of yttrium ions is 40% higher than the resistivity of a tin-doped indium oxide thin film codoped with no europium ions or yttrium ions. The tin-doped indium oxide thin film codoped with 3 mol % of europium ions and 4 mol % of yttrium ions has 4 times higher resistivity than a tin-doped indium oxide thin film codoped with no europium ions or yttrium ions. That codoping with more yttrium ions raises resistivity is apparent.

The present invention provides a tin-doped indium oxide thin film codoped with yttrium ions proportional to 0.1-10 mol % of the tin-doped indium oxide and europium ions proportional to 0.05-5 mol % of the tin-doped indium oxide. According to the foregoing observations, the thin film in accordance with the present invention is transparent and conductive. Preferably, the conductive tin-doped indium oxide thin film is codoped yttrium ions proportional to 0.5-4 mol % of the tin-doped indium oxide and the europium ions proportional to 0.05-5 mol % of the tin-doped indium oxide.

The transparent and conductive tin-doped indium oxide thin film codoped with yttrium ions and europium ions absorbs ultraviolet light at wavelengths shorter than 400 nm and emits light at 611 nm, which is suitable for use as a transparent conductive layer in a solar cell. Furthermore, the tin-doped indium oxide thin film codoped with yttrium ions and europium ions providing down-converting function is also capable of raising photoelectric conversion efficiency of a solar cell. In addition, the thin film in accordance with the present invention may be used in a TFEL device to improve brightness, viewing angle and ruggedness.

The present invention also provides improvement of an aspect of manufacture. The method for making a tin-doped indium oxide thin film codoped with yttrium ions and europium ions in accordance with the present invention uses no vacuum environment so saves manufacturing cost so is favored for industrial application.

The tin-doped indium oxide thin film codoped with yttrium ions and europium ions in accordance with the present invention allows yttrium ions to enhance energy conversion of europium ions in a tin-doped indium oxide thin film and emits light. The technique provide by the present invention has worldwide novelty and is not found in patent literature or non-patent literature of the prior art.

The tin-doped indium oxide thin film codoped with yttrium ions and europium ions in accordance with the present invention luminesces at 611 nm and is thus different from a tin-doped indium oxide thin film doped with only europium ions incapable of luminescing. In other words, the present invention provides a new function that is not found in the prior art. The new function of the thin film in accordance with the present invention is due to the novel and non-obvious structure thereof.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A tin-doped indium oxide thin film comprising
   a tin-doped indium oxide codoped with yttrium ions and europium ions, wherein
   the yttrium ions proportional to 0.1-10 mol % of the tin-doped indium oxide; and
   the europium ions proportional to 0.05-5 mol % of the tin-doped indium oxide.

2. The tin-doped indium oxide thin film as claimed in claim 1, wherein
   the yttrium ions are proportional to 0.5-4 mol % of the tin-doped indium oxide; and
   the europium ions are proportional to 0.05-5 mol % of the tin-doped indium oxide.

3. A method for making a tin-doped indium oxide thin film comprising
   preparing a tin-doped indium oxide; and
   doping yttrium ions proportional to 0.1-10 mol % of the tin-doped indium and europium ions proportional to 0.05-5 mol % of the tin-doped indium oxide in the tin-doped indium oxide using a film-manufacturing method.

4. The method as claimed in claim 3, wherein
   the film-manufacturing method is a sol-gel spin coating method or a metal-organic chemical vapor deposition method.

5. The method as claimed in claim 3, wherein
   the film-manufacturing method is a sputtering method.

6. The method as claimed in claim 4, wherein
   the film-manufacturing method is a sol-gel spin coating method comprising
   mixing an indium precursor and a tin precursor and then an yttrium ion precursor and a europium ion precursor to form a sol-gel solution having tin-doped indium oxide, yttrium ions and europium ions;
   coating with the sol-gel solution and undergoing heat processing to obtain a tin-doped indium oxide thin film.

7. The method as claimed in claim 6, wherein
   the heat processing is at 400° C.

8. The method as claimed in claim 7, the method comprising
   mixing acetic acid and 2-methoxyethanol to obtain a mixture solution;
   adding indium nitrate as an indium ion precursor to the mixture solution and ultrasonically shaking the mixture solution allowing the indium nitrate to be completely solved in the mixture solution;
   mixing tin tetrachloride, as a tin precursor, and absolute ethyl alcohol to obtain a mixture and adding the mixture to the mixture solution, wherein the molar ratio of tin and indium is 90:10;
   adding yttrium nitrate, as an yttrium precursor, and europium nitrate, as a europium precursor, to the mixture solution and stirring for 10 hours at room temperature to obtain a sol-gel solution comprising tin-doped indium oxide, yttrium ions and europium ions;
   evenly distributing the sol-gel solution onto a glass basal plate and performing a first spin coating at 1000 rpm for 10 seconds followed by a second spin coating at 4000 rpm for 30 seconds to obtain a coating layer; and
   drying the coating layer by soft baking at 200° C., raising temperature of a tubular furnace by 5° C. per minute to 400° C., inserting a furnace tube for 30 minutes and holding the temperature for 10 minutes and then removing the furnace tube for 20 minutes to remove organic residues and obtaining a tin-doped indium oxide thin film.

9. The method as claimed in claim 6, the europium ion precursor is selected from a group consisting of europium nitrate, europium carbonate, europium chloride, europium oxalate, europium acetate and europium isopropoxide.

10. The method as claimed in claim 6, the yttrium ion precursor is selected from a group consisting of yttrium nitrate, yttrium carbonate, yttrium chloride, yttrium acetate, yttrium oxalate and yttrium isopropoxide.

11. The method as claimed in claim 6, the indium precursor is selected from a group consisting of indium nitrate, indium chloride, indium ethoxide, indium isopropoxide and indium butoxide.

12. The method as claimed in claim 6, the tin precursor is selected from a group consisting of tin chloride, tin ethoxide, tin isopropoxide and tin butoxide.

* * * * *